(12) United States Patent
Fukuda

(10) Patent No.: US 6,184,569 B1
(45) Date of Patent: Feb. 6, 2001

(54) SEMICONDUCTOR CHIP INSPECTION STRUCTURES

(75) Inventor: Kazuyoshi Fukuda, Tokyo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/098,639

(22) Filed: Jun. 17, 1998

(30) Foreign Application Priority Data

Jan. 13, 1998 (JP) .................................................. 10-005193

(51) Int. Cl.⁷ .............................................. H01L 23/544
(52) U.S. Cl. .......................................... 257/620; 257/48
(58) Field of Search ................ 257/48, 620; 438/17–18; 324/765

(56) References Cited

U.S. PATENT DOCUMENTS 3,689,803 * 9/1972 Baker et al. ..................... 257/620 X
4,243,937 * 1/1981 Multani et al. ..................... 257/48 X

FOREIGN PATENT DOCUMENTS

| 58-182237 | * 10/1983 | (JP) | ....................................... 257/48 |
| 2312255 | 12/1990 | (JP) . | |
| 5-243356 | * 9/1993 | (JP) | ....................................... 257/48 |
| 6-21161 | * 1/1994 | (JP) | ....................................... 257/48 |
| 6-5674 | * 1/1994 | (JP) | ....................................... 257/48 |
| 6-77300 | * 3/1994 | (JP) | ....................................... 257/48 |

* cited by examiner

Primary Examiner—John Guay
(74) Attorney, Agent, or Firm—Leydig, Voit & Mayer, Ltd.

(57) ABSTRACT

An external inputting/outputting line connecting an external connection pad with an internal circuit is located along a peripheral edge of a semiconductor chip, between the edge and the external connection pad.

4 Claims, 8 Drawing Sheets

SEMICONDUCTOR CHIP INSPECTION STRUCTURES

BACKGROUND OF THE INVENTION

1. Field of the Invention

The present invention relates to a semiconductor chip on which an electrical circuit is arranged including circuit devices such as transistors and resistors connected with each other by wiring. More particularly, the present invention relates to a semiconductor chip and an inspection method suitable for efficient identification of defects produced when the chip is formed from a wafer.

2. Description of the Prior Art

FIG. 11 is a front view showing the configuration of a prior art semiconductor chip. In the Figure, reference numerals 6 each designate internal circuits formed on a central part of a semiconductor substrate; reference numerals 5 each designate external connection pads which are arranged along a peripheral edge of the semiconductor substrate for connection of bonding wires and so on thereto; and reference numerals 19 each designate external inputting/outputting lines for respectively connecting each of the external connection pads 5 with each of the internal circuits 6.

Besides, such a semiconductor chip is formed by forming circuit devices such as transistors, using techniques such as an ion implantation, on a wafer composed of a semiconductor and, after laminating wirings for connecting the circuit devices with each other on the wafer, by dicing of the wafer.

Since the prior art semiconductor chip is configured as stated above, chipping occurs at the time of the dicing, diffusion variations occur in diffusion region by a change in factors such as ion implantation efficiency, or there arise variations in thickness of the wirings. In particular, concerning the above-mentioned wafer, a single crystal rod, which is an original material thereof, is formed in a cylindrical shape, and also, in recent years, an area of the wafer tends to be upsized. Consequently, there is a tendency to easily produce characteristic differences between a central part and a peripheral part of the wafer, and it becomes impossible to avoid the occurrences of such problems described above.

In addition, in the prior art, in order to distinguish and select this kind of defective chips as early as possible, an interface test (hereinafter, referred to as "IF test") is carried out at the beginning of a chip test. The IF test is, in general, a test to bring a single probe needle into contact with every external connection pad 5, measure a diode characteristic using this probe needle, and perform acceptable/defective product judgement by comparing the measurement result with a predetermined characteristic. If a chip is an acceptable chip as is the case with the above-mentioned FIG. 11, the chip passes the chip test and is then sent to a next semiconductor device fabricating process.

Incidentally, performed as the chip test other than this are tests such as an electrical characteristic test and a function test.

As above, the IF test is the test to bring an inspection needle into contact with every external connection pad 5, measure the diode characteristic of the semiconductor substrate being in the state, and perform the acceptable/defective product judgement depending on whether the result is the desired one or not.

FIG. 12 is a front view showing a configuration of a prior art semiconductor chip about 30% of the area of which has been chipped. In the Figure, reference numerals 21 each designate chipped external connection pads which are supposed to be disposed inside the above-mentioned chipped region, and reference numerals 20 each designate chipped external inputting/outputting lines which are supposed to be disposed inside the above-mentioned chipped region. The construction other than the above described is similar to that in FIG. 11, and thus the same numerals designate like elements and the description of them will be omitted. In case of such a prior art semiconductor chip about 30% of which has been chipped, it is possible to reject the chip as a defective product at the above-described IF test because the chip lacks the external connection pads 21.

On the other hand, FIG. 13 is a front view showing a configuration of a prior art semiconductor chip about 10% of the area of which has been chipped. The construction other than the above described is similar to that in FIG. 12, and thus the same numerals designate like elements and the description of them will be omitted. In case of such a semiconductor chip about 10% of which has been chipped, the chip must usually be rejected as a defective product in order to assure the reliability at the time of being formed into a semiconductor device. In this case, however, there exist all the external connection pads 5. Consequently, it turns out that the desired characteristic is obtained at the above-mentioned IF test and thus it becomes impossible to reject the chip as a defective product.

As a result, in order to distinguish and select this kind of defective product in an actual manufacturing process, each semiconductor chip had to be inspected by employing a visual inspection thereof. In such an inspection in reliance on help of humans, there occur variations in the content inspected. Consequently, there remain chips which, essentially, have to be judged as defective products so as to maintain the above-described reliability, and eventually there remains a possibility that a semiconductor device in which such defective chips are used has been formed.

Also, with the above-mentioned IF test, depending on the relation between the chipped members/region and an inspecting order of the external connection pads 5, there is a case in which it is not until a plurality of external connection pads 5 are inspected that the chip has been judged as a defective product. In that case, there exists a problem that the inspecting time, which was needed for measuring the external connection pads 5 until then, has ended in vain.

Accordingly, as disclosed in JP-A No. Hei 2-312255, it can be considered to judge a chipped or damaged chip at a testing process specifically designed therefor. FIG. 14 is a front view showing a configuration embodiment of another prior art semiconductor chip to which such an inspecting method is applied. In the Figure, reference numerals 22 each designate detecting pads provided independently of the external connection pads 5, and reference numeral 23 designates a detecting line disposed along the whole peripheral edge of the chip and connecting the two detecting pads 22, 22 with each other. The construction other than the above described is similar to that in the prior art semiconductor chip shown in FIG. 11, and thus the same numerals designate like elements and the description of them will be omitted.

Also, FIG. 15 is a front view showing a configuration of the another prior art semiconductor chip about 10% of the area of which has been chipped, and FIG. 16 is a front view showing a configuration of the another prior art semiconductor chip about 30% of the area of which has been chipped.

Incidentally, in the Figures, reference numeral 26 designates a chipped inspecting line which is supposed to be disposed inside the chipped region, and reference numerals 25 designate chipped external inputting/outputting pads which are supposed to be disposed inside the chipped region.

Moreover, in such a method of inspecting a semiconductor chip, a probe needle is brought into contact with the above-stated two detecting pads 22, 22. If an electrical conduction is found therebetween, the chip is judged to be an acceptable product, and if no electrical conduction is found, the chip is judged to be a defective product. Thus, it is possible to judge, as a defective product, not only the semiconductor chip on which the external connection pads 25 are chipped as shown in FIG. 16 but also the semiconductor chip chipped to such an extent that the external connection pads 5 are not chipped as shown in FIG. 15, because the chipping can be detected as a chipping of the inspecting line 26. As a result, it becomes possible to assure the reliability of a semiconductor device, and what is more, to perform the inspecting with a high efficiency.

However, if trying to form the detecting pads 22, and inspecting line 26 specifically designed for simply detecting the chipping only in this way, there emerges a problem of an increase in the chip area.

SUMMARY OF THE INVENTION

In view of the above-mentioned points, an object of the present invention is to obtain a semiconductor chip which makes it possible to easily judge and distinguish a defective chip without forming pads and wiring specifically designed for simply detecting the chipping only.

In order to attain the above-described object, according to a first aspect of the present invention, there is provided a semiconductor chip having an external inputting/outputting line, which is formed in such a manner as to pass through between a peripheral edge of the semiconductor chip and a position at which an external connection pad is formed and connect the external connection pad with an internal circuit. This makes it possible to obtain an effect of judging and rejecting a chip as a defective one even if the chipping is produced at only the peripheral edge part thereof.

According to a second aspect of the present invention, there is provided a semiconductor chip on at least a corner part of which the external inputting/outputting line is formed. This makes it possible to obtain an effect of surely detecting a corner part of the chip at which a chipping is apt to be produced and of improving the judgment accuracy.

According to a third aspect of the present invention, there is provided a semiconductor chip comprising a plurality of power supply pads for supplying an identical power supply voltage, a peripheral edge power supply line which is wired in such a manner as to pass through between a peripheral edge of the semiconductor chip and a position at which an external connection pad is formed and connect the plurality of power supply pads with each other, and a power supply lead-in line for supplying each part of the internal circuits with a power supply from the peripheral edge power supply line. This makes it possible to obtain the effect of judging and rejecting a chip as a defective one even if the chipping is produced at only the peripheral edge part thereof.

According to a fourth aspect of the present invention, there is provided a semiconductor chip on at least a corner part of which a peripheral edge power supply line is formed. This makes it possible to obtain the effect of surely detecting a corner part of the chip at which a chipping is apt to be produced and of improving the judgment accuracy.

According to a fifth aspect of the present invention, there is provided a semiconductor chip comprising a detecting element formed on a semiconductor substrate between a peripheral edge of the semiconductor chip and a position at which an external connection pad is formed, a detecting pad for measuring characteristics of the detecting element, and a detecting line for connecting the detecting pad with the detecting element. This makes it possible to obtain the effect of judging and rejecting a chip as a defective one even if the chipping is produced at only the peripheral edge part thereof.

According to a sixth aspect of the present invention, there is provided a semiconductor chip on at least a corner part of which the detecting element is formed. This makes it possible to obtain the effect of surely detecting a corner part of the chip at which a chipping is apt to be produced and of improving the judgment accuracy.

BRIEF DESCRIPTION OF THE DRAWINGS

The other objects and advantages of the present invention can be understood more perfectly by reading the following detailed explanation with reference to and in inspecting with the accompanying drawings.

DETAILED DESCRIPTION OF THE PREFERRED EMBODIMENTS

The description will be given below concerning preferred embodiments of the present invention, referring to the accompanying drawings.

Embodiment 1

Figure 1:
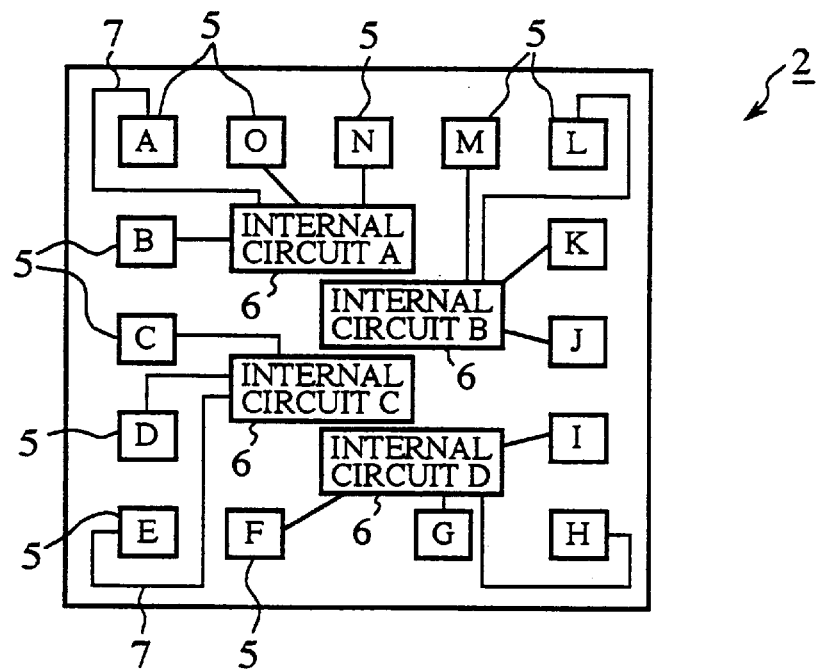
FIG. 1 is a front view showing a semiconductor chip according to a first embodiment (Embodiment 1) for carrying out the present invention.

FIG. 1 is a front view showing a semiconductor chip according to Embodiment 1 of the present invention. In the Figure, reference numerals 6 each designate internal circuits formed on a central part of a semiconductor substrate, reference numerals 5 each designate external connection pads which are arranged along a peripheral edge of the semiconductor substrate so as to connect bonding wires and so on, and reference numerals 7 each designate external inputting/outputting lines for respectively connecting each of the external connection pads 5 with each of the internal circuits 6. In particular, the external inputting/outputting lines 7 connected to the external connection pads 5 at four corners of the chip are wired in such a manner that the external inputting/outputting lines, at the corners of the chip at which the external connection pads 5 exist, pass between the peripheral edge of the chip and positions at which the external connection pads are formed and are then connected with the internal circuits 6.

Figure 2:
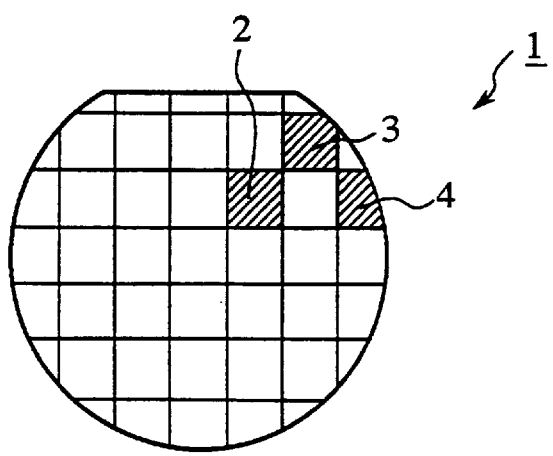
FIG. 2 is a front view showing a wafer on which a large number of semiconductor chips according to Embodiment 1 are formed.

FIG. 2 is a front view showing a wafer on which the above-mentioned large number of semiconductor chips are formed. In the Figure, reference numeral 1 designates the wafer, reference numeral 2 designates a semiconductor chip on which the semiconductor pattern has been completely formed, reference numeral 3 designates a semiconductor chip about 10% of the chip area of which has been chipped, and reference numeral 4 designates a semiconductor chip about 30% of the chip area of which has been chipped.

Besides, the above-described semiconductor chips 2, 3, 4 are formed by forming circuit devices such as transistors, using techniques such as an ion implantation, on a wafer composed of a semiconductor and, after laminating wirings for connecting the circuit devices with each other on the wafer, by performing a dicing of the wafer.

Described next is a method of inspecting a semiconductor chip in the Embodiment 1.

The method is a test to first bring a probe needle into contact with the above-stated external connection pads 5 at the four corners one after another, measure the diode characteristic using this probe needle, and perform acceptable/defective product judgement by comparing the measurement result with a predetermined characteristic. If a chip is an acceptable chip as is the case with the above-mentioned FIG. 1, the chip passes the chip test and is then sent to a next semiconductor device fabricating process.

Figure 3:
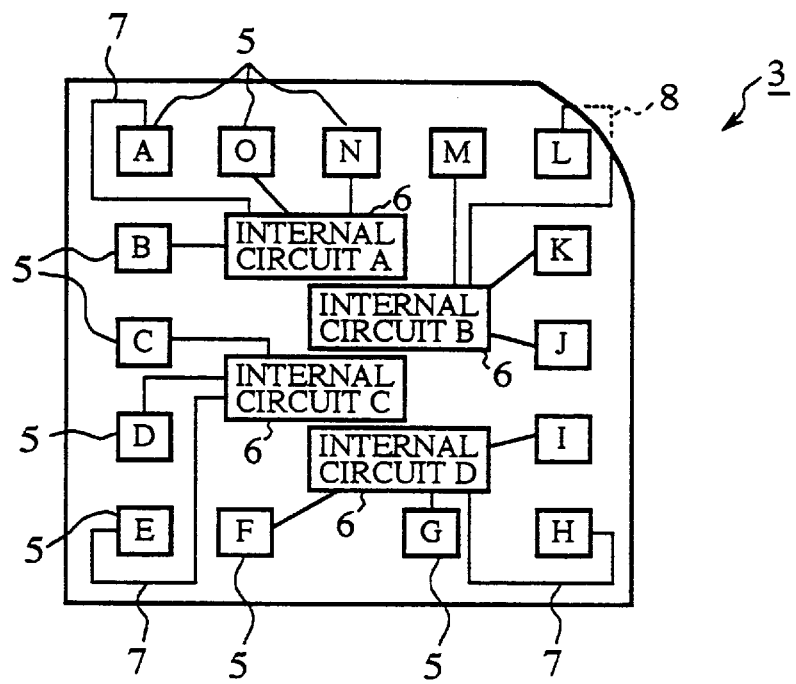
FIG. 3 is a front view showing the semiconductor chip according to the Embodiment 1, about 10% of the chip area of which has been chipped.
Figure 4:
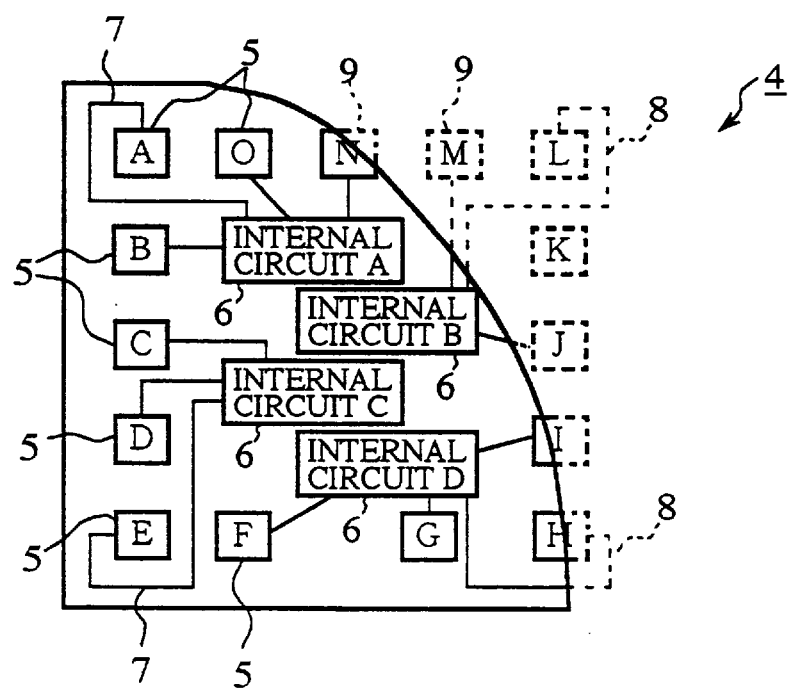
FIG. 4 is a front view showing the semiconductor chip according to the Embodiment 1, about 30% of the chip area of which has been chipped.

FIG. 3 is a front view showing a semiconductor chip about 10% of the above-mentioned chip area of which has been chipped. FIG. 4 is a front view showing a semiconductor chip about 30% of the above-mentioned chip area of which has been chipped. In the Figures, reference numerals 8 designate chipped external inputting/outputting lines which are supposed to be disposed inside the chipped region, and reference numerals 9 designate chipped external inputting/outputting pads which are supposed to be disposed inside the chipped region. The construction other than the above described is similar to that in FIG. 1, and thus the same numerals designate like elements and the description will be omitted.

Concerning the above-described semiconductor chip the peripheral edge part of which has been chipped, it is impossible to obtain a predetermined diode characteristic at the above-mentioned test and thus such a semiconductor chip is judged to be a defective product.

Additionally, semiconductor chips which have been judged to be acceptable products at the chipping test, after being tested at the other chip tests, are completed into a semiconductor device.

As described above, according to the Embodiment 1, it is possible to reject a chipped chip as a defective chip by testing electrical characteristics of the external connection pads 5 at the four corners. Consequently, it is possible to judge, as a defective product, not only the semiconductor chip on which the external connection pads 9 are chipped as shown in FIG. 4 but also the semiconductor chip chipped to such an extent that the external connection pads 5 are not chipped as shown in FIG. 3, because the chipping can be detected as chipping of the external inputting/outputting lines 8. Thus, the problem of the reliability, which was found in the conventional judgement relying on the visual inspection, never occurs. Also, even when a chip has been formed to be a defective one because of causes other than the chipping, for example, a case when wiring used as the external inputting/outputting lines 7 has been formed to be thinner than a desired thickness (a case of faulty wiring), it is possible to judge and reject it by inspecting variations in the electrical characteristics.

Also, there is no need of furnishing pads specifically designed for measuring the chipping, and thus there emerges no problem of an increase in the chip area.

Furthermore, since the above-described test is executed at the beginning of the chip tests in the Embodiment 1, if the judgement is performed concerning at most four external connection pads 5 at the four corners, it becomes possible to surely judge a defective chip due to the chipping and, what is more, there is no possibility that the inspecting time has ended in vain.

Embodiment 2

Figure 5:
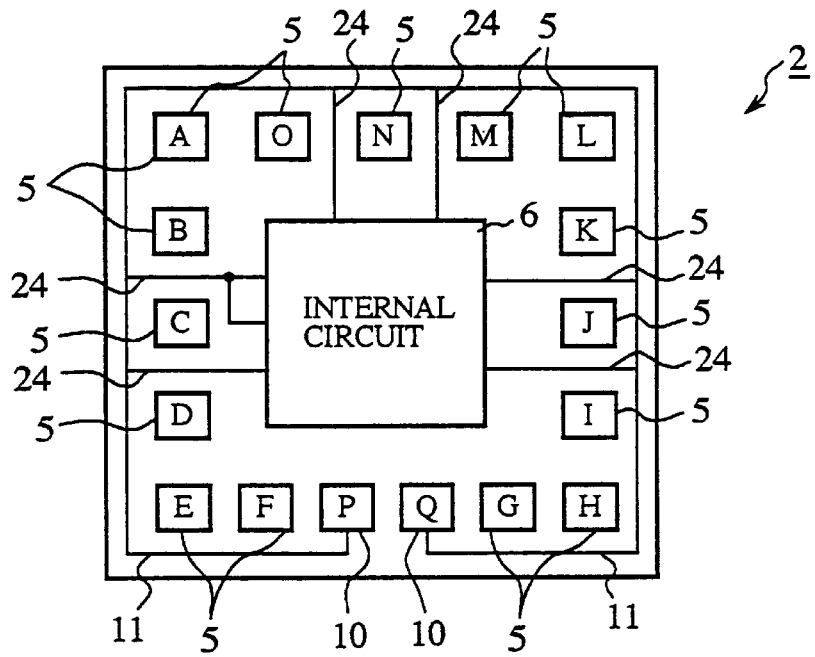
FIG. 5 is a front view showing a semiconductor chip according to a second embodiment (Embodiment 2) for carrying out the present invention.

FIG. 5 is a front view showing a semiconductor chip according to Embodiment 2 of the present invention. In the Figure, reference numerals 10 each designate power supply pads for supplying the chip with an identical power supply voltage, reference numeral 11 designates a peripheral edge power supply line which is wired along the whole peripheral edge of the above-mentioned semiconductor chip in such a manner as to pass through between the peripheral edge and positions at which pads are formed and connect the above-stated two power supply pads 10, 10 with each other, and reference numerals 24 designate power supply lead-in lines for supplying each part of internal circuits 6 with a power supply from the peripheral edge power supply lines 11. The construction other than the above described is similar to that in the Embodiment 1, and thus the same numerals designate like elements and the description will be omitted.

Also, the present semiconductor chip has been formed in the same method as that in the first embodiment.

Described next is a method of inspecting a semiconductor chip in the Embodiment 2.

The test to be executed is a test to first bring a probe needle into contact with the above-stated two power supply pads 10, 10, measure a characteristic of the power supply wiring using this probe needle, and perform acceptable/defective product judgement by comparing the measurement result with a predetermined characteristic. If a chip is an acceptable chip as shown in FIG. 5, the chip passes the chip test and is then sent to a next semiconductor device fabricating process.

Figure 6:
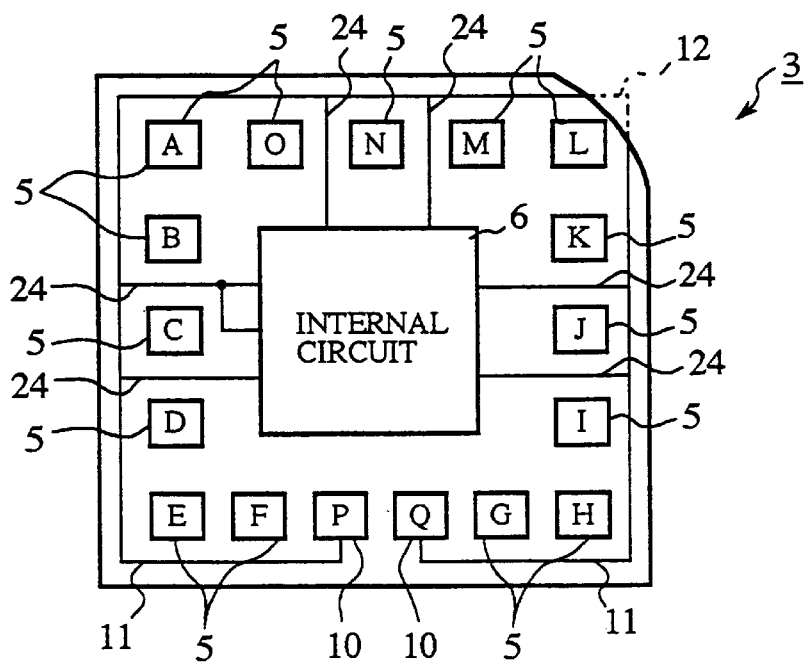
FIG. 6 is a front view showing the semiconductor chip according to the Embodiment 2, about 10% of the chip area of which has been chipped.
Figure 7:
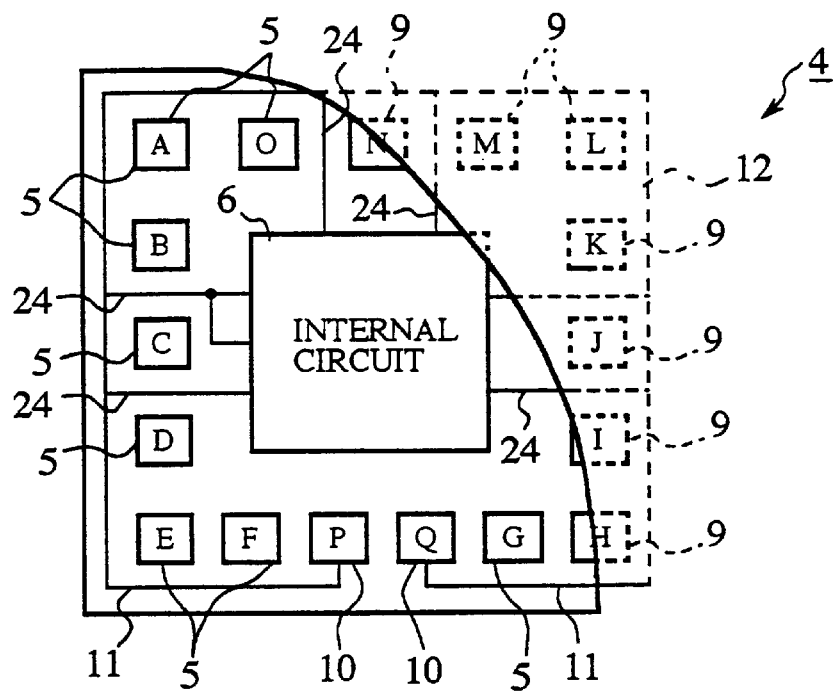
FIG. 7 is a front view showing the semiconductor chip according to the Embodiment 2, about 30% of the chip area of which has been chipped.

FIG. 6 is a front view showing a semiconductor chip about 10% of the chip area of which has been chipped, and FIG. 7 is a front view showing a semiconductor chip about 30% of the chip area of which has been chipped. In the Figures, reference numeral 12 designates a chipped external inputting/outputting line which is supposed to be disposed inside the chipped region, and reference numerals 9 designate chipped external inputting/outputting pads which are supposed to be disposed inside the chipped region. The construction other than the above described is similar to that in FIG. 5, and thus the same numerals designate like elements and the description will be omitted.

Concerning the above-described semiconductor chip the peripheral edge part of which has been chipped, it is impossible to obtain a predetermined power supply wiring characteristic at the above-mentioned test and thus such a semiconductor chip is judged to be a defective product.

Additionally, semiconductor chips which have been judged to be acceptable products at the chipping test, after being tested at the other chip tests, are completed into a semiconductor device.

As described above, according to the Embodiment 2, it is possible to reject a chipped chip as a defective chip by testing electrical characteristics of the power supply pads 10, 10 formed along the peripheral edge of the chip. Consequently, it is possible to judge, as a defective product, not only the semiconductor chip on which the external connection pads 9 are chipped as shown in FIG. 7 but also the semiconductor chip chipped to such an extent that the external connection pads 5 are not chipped as shown in FIG. 6, because the chipping can be detected as a chipping of a peripheral edge power supply line 12. Thus, the problem of the reliability, which was found in the conventional judgement relying on the visual inspection, never occurs.

Also, even when a chip has been formed to be a defective one because of causes other than the chipping, for example, a case when a wiring used as the peripheral edge power supply line 11 has been formed to be thinner than a desired thickness (a case of faulty wiring), it is possible to judge and reject it by inspecting variations in the power supply wiring characteristic.

Also, there is no need of furnishing pads specifically designed for measuring the chipping, and thus there emerges no problem of an increase in the chip area.

Furthermore, since the above-described test is executed at the beginning of the chip tests in the second embodiment, it becomes possible to surely judge a defective chip due to the chipping and, what is more, there is no possibility that the inspecting time has ended in vain.

Embodiment 3

Figure 8:
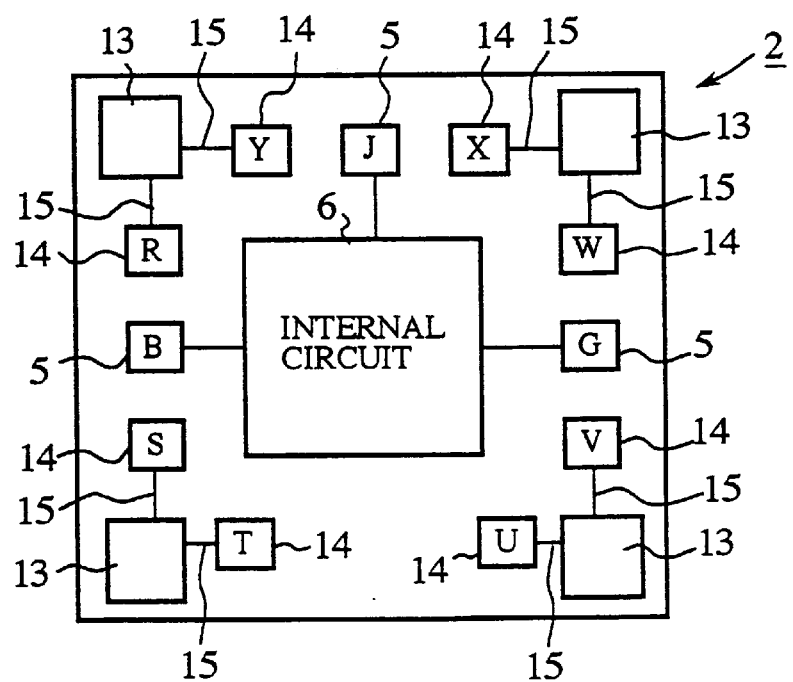
FIG. 8 is a front view showing a semiconductor chip according to a third embodiment (Embodiment 3) for carrying out the present invention.

FIG. 8 is a front view showing a semiconductor chip according to Embodiment 3 of the present invention. In the Figure, reference numerals 13 each designate detecting elements formed at four corners of the semiconductor substrate between the peripheral edge of the chip and positions at which pads are formed; reference numerals 14 designate a plurality of detecting pads for measuring characteristics of the chip; and reference numerals 15 each designate detecting lines for connecting the detecting pads 14 with the above-stated detecting elements 13. The construction other than the above-described is similar to that in the Embodiment 1, and thus the same numerals designate like elements and the description will be omitted.

Also, the present semiconductor chip has been formed in the same method as that in the first embodiment.

Described next is a method of inspecting a semiconductor chip in the Embodiment 3.

The method is a test to first bring a probe needle into contact with each set of the above-stated detecting pads 14, 14, measure characteristics of the detecting elements 13 using this probe needle, and perform acceptable/defective product judgement by comparing the measurement result with predetermined characteristics. If a chip is an acceptable chip as shown in FIG. 8, the chip passes the chip test and is then sent to a next semiconductor device fabricating process.

Figure 9:
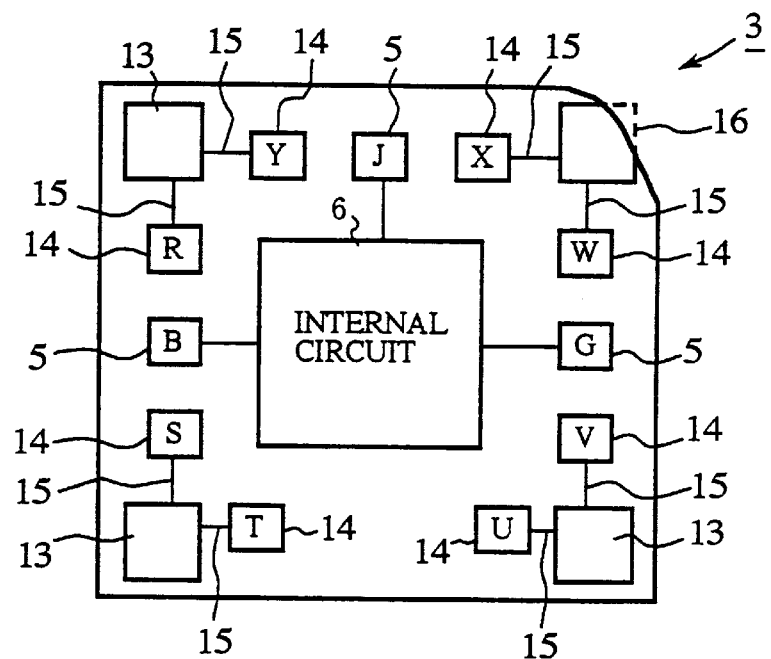
FIG. 9 is a front view showing the semiconductor chip according to the Embodiment 3, about 10% of the chip area of which has been chipped.
Figure 10:
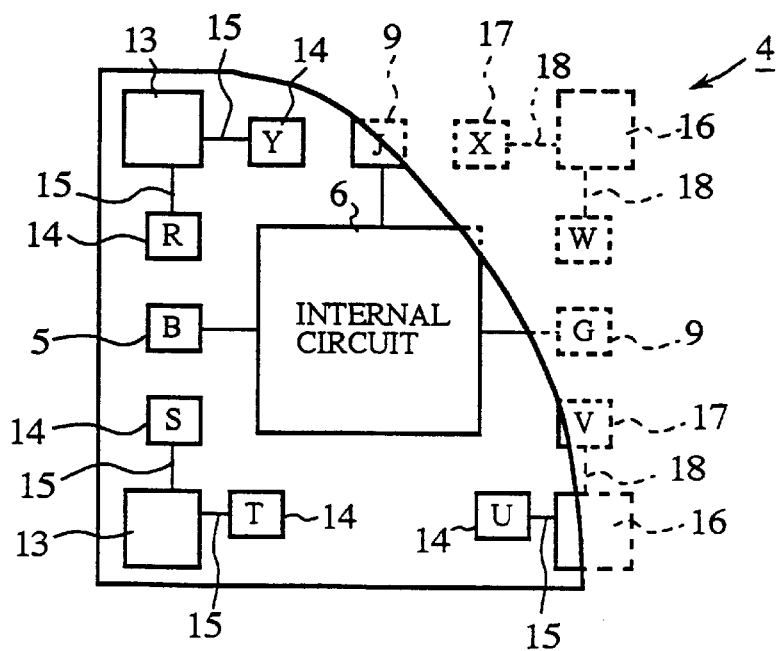
FIG. 10 is a front view showing the semiconductor chip according to the Embodiment 3, about 30% of the chip area of which has been chipped.
Figure 11:
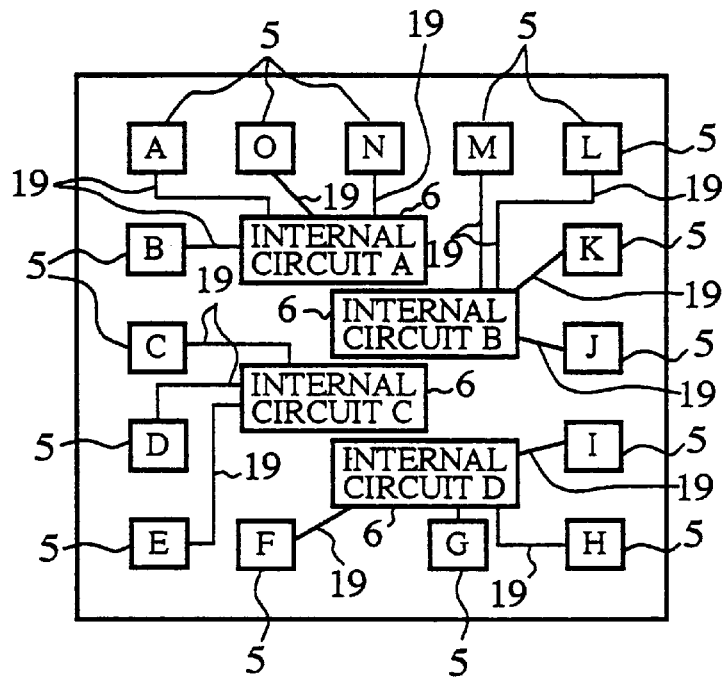
FIG. 11 is a front view showing a configuration of a prior art semiconductor chip.
Figure 12:
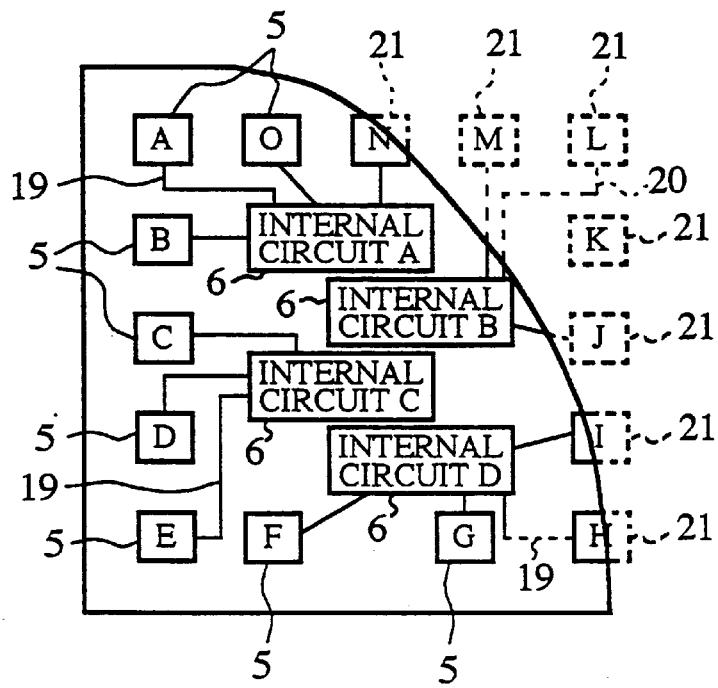
FIG. 12 is a front view showing a prior art semiconductor chip about 30% of the chip area of which has been chipped.
Figure 13:
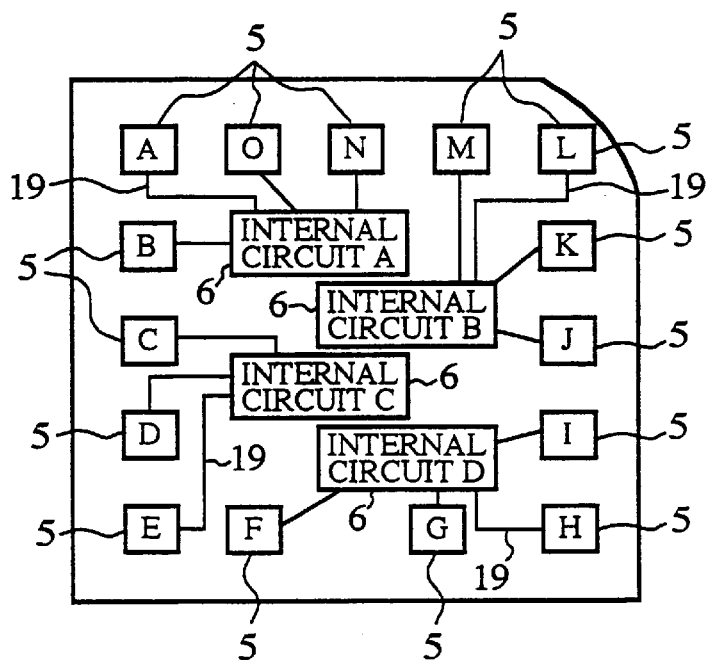
FIG. 13 is a front view showing a prior art semiconductor chip about 10% of the chip area of which has been chipped.
Figure 14:
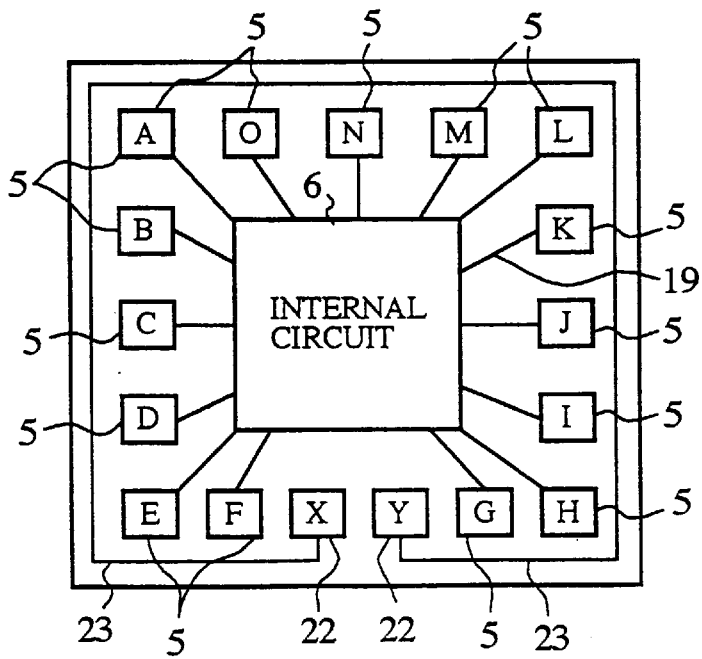
FIG. 14 is a front view showing a configuration of another prior art semiconductor chip.
Figure 15:
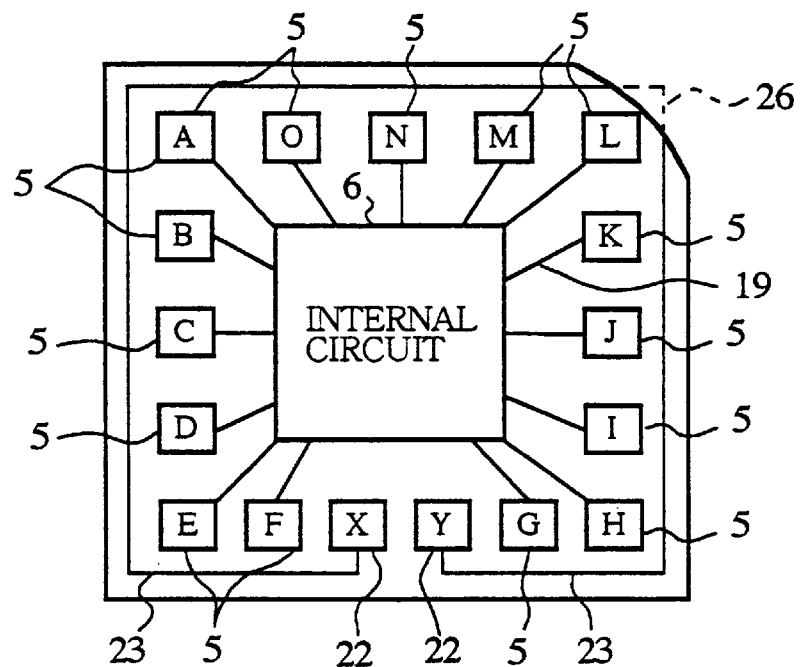
FIG. 15 is a front view showing the another prior art semiconductor chip about 10% of the chip area of which has been chipped.
Figure 16:
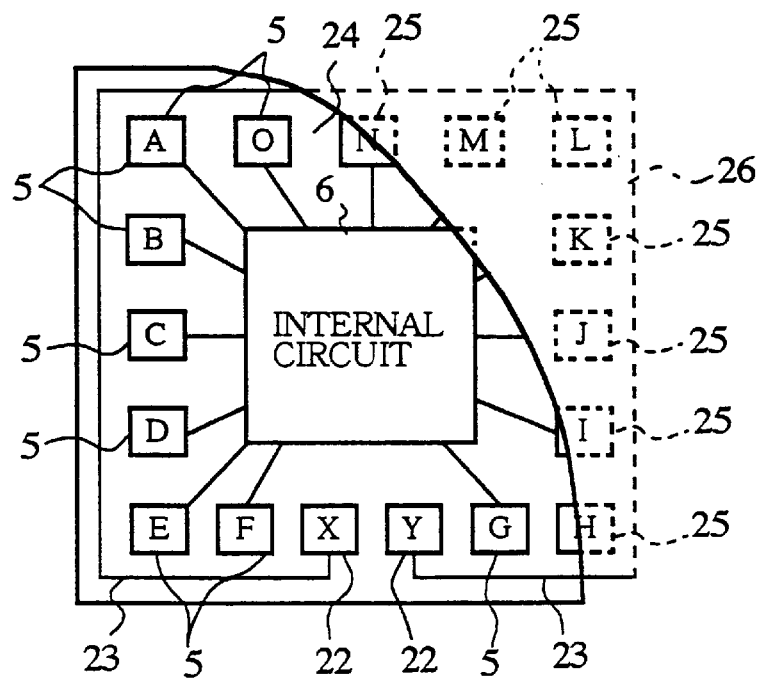
FIG. 16 is a front view showing the another prior art semiconductor chip about 30% of the chip area of which has been chipped.

FIG. 9 is a front view showing a semiconductor chip about 10% of the chip area of which has been chipped, and FIG. 10 is a front view showing a semiconductor chip about 30% of the chip area of which has been chipped. In the Figures, reference numerals 16 designate chipped detecting elements which are supposed to be disposed inside the chipped region; reference numerals 18 designate chipped detecting lines which are supposed to be disposed inside the chipped region; and reference numerals 17 designate chipped detecting pads which are supposed to be disposed inside the chipped region. The construction other than the above described is similar to that in FIG. 8, and thus the same numerals designate like elements and the description will be omitted.

Concerning the above-described semiconductor chip the peripheral edge part of which has been chipped, it is impossible to obtain predetermined characteristics of the detecting elements 13 at the above-mentioned test and thus such a semiconductor chip is judged to be a defective product.

Additionally, semiconductor chips which have been judged to be acceptable products at the chipping test, after being tested at the other chip tests, are completed into a semiconductor device.

As described above, according to the Embodiment 3, it is possible to reject a chipped chip as a defective chip by testing electrical characteristics of the detecting elements 13 formed at the four corners of the chip. Consequently, it is possible to judge, as a defective product, not only the semiconductor chip on which the external connection pads 9 are chipped as shown in FIG. 10 but also the semiconductor chip chipped to such an extent that the external connection pads 5 are not chipped as shown in FIG. 9, because the chipping can be detected as chipping of the detecting elements 16. Thus, the problem of the reliability, which was found in the conventional judgement relying on the visual inspection, never occurs.

Also, even when a chip has been formed to be a defective one because of causes other than the chipping, for example, a case when wiring used as the detecting lines 15 have been formed to be thinner than a desired thickness (a case of faulty wiring) or a case when desired characteristics of the detecting elements 13 have not been obtained due to diffusion variations in diffusion region inside the semiconductor substrate (a case of poor diffusion), it is possible to judge and reject it by inspecting variations in the characteristics of the detecting elements 13.

Furthermore, since the above-described test is executed at the beginning of the chip tests in the third embodiment, it becomes possible to surely judge a defective chip due to the chipping and, what is more, there is no possibility that the inspecting time has ended in vain.

Although the descriptions have been given in the precedings concerning the preferred embodiments of the present invention, these descriptions are just illustrative, and accordingly it should be understood that variations or modifications from these descriptions can be made without departing from the spirit and scope of the following claims.

What is claimed is:

1. A semiconductor chip comprising:

an external connection pad for establishing electrical connection with an external circuit device;

an internal circuit connected to said external connection pad for performing a specific operation; and an external inputting/outputting line connecting said external connection pad with said internal circuit wherein said external inputting/outputting line passes along a corner and between a peripheral edge of said semiconductor chip and said external connection pad.

2. The semiconductor chip as claimed in claim 1, wherein said external connection pad is located at a corner of said semiconductor chip.

3. A semiconductor chip comprising:

an external connection pad for establishing electrical connection with an external circuit device;

an internal circuit connected to said external connection pad for performing a specific operation;

an external inputting/outputting line connecting said external connection pad with said internal circuit;

a plurality of power supply pads for supplying an identical power supply voltage;

a peripheral edge power supply line passing between a peripheral edge of said semiconductor chip and said external connection pad connecting said plurality of power supply pads to each other; and a power supply lead-in line for supplying power to said internal circuit from said peripheral edge power supply line.

4. The semiconductor chip as claimed in claim 3, wherein said peripheral edge power supply line is present at least on a corner of said semiconductor chip.

* * * * *